US007291021B2

(12) United States Patent
Shirai et al.

(10) Patent No.: US 7,291,021 B2
(45) Date of Patent: Nov. 6, 2007

(54) IC SOCKET AND IC SOCKET ASSEMBLY

(75) Inventors: Hiroshi Shirai, Saitama (JP); Shinichi Hashimoto, Kanagawa (JP)

(73) Assignee: Tyco Electronics AMP K.K., Kanagawa-ken (JP)

( * ) Notice: Subject to any disclaimer, the term of this patent is extended or adjusted under 35 U.S.C. 154(b) by 0 days.

(21) Appl. No.: 11/202,277

(22) Filed: Aug. 11, 2005

(65) Prior Publication Data

US 2006/0035539 A1 Feb. 16, 2006

(30) Foreign Application Priority Data

Aug. 11, 2004 (JP) ............................ 2004-234242

(51) Int. Cl.
*H05K 1/00* (2006.01)

(52) U.S. Cl. ........................................................ 439/71

(58) Field of Classification Search .................. 439/71, 439/73, 66, 331

See application file for complete search history.

(56) References Cited

U.S. PATENT DOCUMENTS

| | | | | |
|---|---|---|---|---|
| 4,761,140 | A | 8/1988 | Geib | 439/71 |
| 5,702,255 | A * | 12/1997 | Murphy et al. | 439/71 |
| 5,938,451 | A * | 8/1999 | Rathburn | 439/66 |
| 6,474,997 | B1 * | 11/2002 | Ochiai | 439/70 |
| 6,719,569 | B2 * | 4/2004 | Ochiai | 439/66 |
| 6,731,516 | B1 * | 5/2004 | Ma | 361/802 |
| 6,749,441 | B1 * | 6/2004 | Ma | 439/66 |
| 6,827,586 | B2 * | 12/2004 | Noda et al. | 439/71 |
| 6,887,114 | B2 * | 5/2005 | Liao | 439/862 |
| 6,908,313 | B2 * | 6/2005 | Walkup et al. | 439/66 |
| 6,914,192 | B2 * | 7/2005 | Ju | 174/94 R |
| 6,921,271 | B2 * | 7/2005 | Liao et al. | 439/66 |
| 6,929,483 | B2 * | 8/2005 | Huang et al. | 439/66 |
| 2002/0182901 | A1 | 12/2002 | Koopman et al. | 439/71 |

FOREIGN PATENT DOCUMENTS

| | | |
|---|---|---|
| JP | 5-90378 | 4/1993 |
| JP | 7-282931 | 10/1995 |
| JP | 8-241776 | 9/1996 |

* cited by examiner

*Primary Examiner*—Gary F. Paumen
(74) *Attorney, Agent, or Firm*—Barley Snyder LLC

(57) ABSTRACT

An integrated circuit socket comprises an insulative housing having an integrated circuit package receiving recess provided with a plurality of contact receiving openings arranged in a matrix. Contacts are arranged in the contact receiving openings. Each of the contacts has a base fixed to the contact receiving opening and a contact arm that extends away from the base. The contact arm has a contact portion with a contact point at an uppermost end. The contact portion overlaps with the contact arm of an adjacent one of the contacts. First partition walls separate the contact receiving openings in a direction substantially perpendicular to a direction in which the contact arms extend. The uppermost ends are arranged below tops of the first partition walls.

19 Claims, 7 Drawing Sheets

IC SOCKET AND IC SOCKET ASSEMBLY

FIELD OF THE INVENTION

The invention relates to an integrated circuit (IC) socket that receives a Land Grid Array (LGA) IC package and an assembly therefore. More particularly, the invention relates to a contact and a contact arrangement for an IC socket that receives an LGA IC package and an assembly therefore.

BACKGROUND OF THE INVENTION

Japanese Unexamined Patent Publication No. 8(1996)-241776 discloses an example of an IC socket, which is used in electronic devices, such as personal computers. The IC socket comprises two types of sideways facing U-shaped contacts, which are mounted in a housing by base portions thereof. One end of each of the contacts is mounted in the housing, and the other end of the contact is formed as a contact arm for contacting an IC package. The two types of contacts are of different sizes, and the contact arms are arranged such that the contact arms overlap each other.

Japanese Unexamined Patent Publication No. 7(1995)-282931 discloses another example of an IC socket. The IC socket includes contacts that extend substantially linearly in a horizontal direction and are alternately provided in a housing by leg portions thereof. Contact portions are formed where the contacts and electrodes of an IC package connect and are formed at ends of the horizontally extending portions of the contacts in an upwardly facing manner.

In the IC socket disclosed in Japanese Unexamined Patent Publication No. 8(1996)-241776, it is difficult to arrange the contacts in a matrix and at a high density, because of the horizontally extending contact arms. In the IC socket disclosed in Japanese Unexamined Patent Publication No. 7(1995)-282931, it is also difficult to arrange the contacts in a matrix and at a high density, because the contacts extend in the horizontal direction.

In both of the IC sockets described above, the contact portions that contact electrodes of an IC package protrude upward. Therefore, there is a possibility that external objects, such as fingers, will contact the exposed contact portions during mounting or dismounting of the IC package onto the IC socket. Because the mounting and dismounting of the IC package is performed by hand, the possibility of this type of damage occurring is great. In the case that a finger or the like contacts the contact portions, external force is applied thereto, which may cause plastic deformation of the contact portions. If the contact portions are deformed, there is a possibility that electrical connections will not be established between the IC package and the contacts of the IC socket.

In an effort to address this problem, contacts having relatively large curved portions at tips thereof have been developed to reduce the likelihood that external objects will deform the contacts. FIG. 10 is a sectional view of a contact portion 162 of a conventional contact 156 having such a configuration. The contacts 156 are mounted within contact receiving openings 154 of an insulative housing 152. Contact arms 158 of the contacts 156 protrude upward from an upper surface 160 of the housing 152. The contact portions 162 formed at tips of the contact arms 158 have upwardly convex curved portions 163 for contacting electrodes (not shown) of an IC package (not shown). Tips 162*a* of the contact portions 162 curve toward the insulative housing 152 so that external objects are prevented from engaging the contact portions 162 and deforming the contact arms 158.

In the conventional contact illustrated in FIG. 10, the tips 162*a* of the contact portions 162 are bent such that the tips 162*a* curve downward. It is therefore difficult to provide sufficient space in a vertical direction of the housing 152 such that the contact portions 162 do not interfere with the adjacent contacts 156. There is therefore a possibility that the tips 162*a* of the contact portions 162 will contact the contact arm 158 of the adjacent contacts 156 when the contact arms 158 are flexed by the electrodes (not shown) of the IC package (not shown), thereby shorting the connection there between. Because it is difficult to arrange the contacts 156 such that the contacts 156 overlap and such that the positions of the contacts 156 are shifted so that the contact arms 158 do not interfere with each other even when flexed, this type of configuration causes the arrangement pitch of the contacts 156 in the horizontal direction to be great. It is therefore difficult to make high density arrangements of the contacts 156. Additionally, because the contacts 156 are exposed from the housing 152, there is a possibility that the contacts 156 will become damaged or soiled when touched by the external objects. If the contacts 156 become damaged or soiled, the reliability of the electrical connections established thereby can be reduced.

SUMMARY OF THE INVENTION

It is therefore an object of the invention to provide an IC socket that enables a high density arrangement of contacts and prevents deformation of the contacts by external objects.

This and other objects are achieved by an integrated circuit socket comprising an insulative housing having an integrated circuit package receiving recess provided with a plurality of contact receiving openings arranged in a matrix. Contacts are arranged in the contact receiving openings. Each of the contacts has a base fixed to the contact receiving opening and a contact arm that extends away from the base. The contact arm has a contact portion with a contact point at an uppermost end. The contact portion overlaps with the contact arm of an adjacent one of the contacts. First partition walls separate the contact receiving openings in a direction substantially perpendicular to a direction in which the contact arms extend. The uppermost ends are arranged below tops of the first partition walls.

This and other objects are further achieved by an integrated circuit socket comprises an insulative housing having an integrated circuit package receiving recess provided with a plurality of contact receiving openings arranged in a matrix. Contacts are arranged in the contact receiving openings. Each of the contacts has a base fixed to the contact receiving opening and a contact arm that extends away from the base. The contact arm overlaps with the contact arm of an adjacent one of the contacts. First partition walls separate the contact receiving openings in a direction substantially perpendicular to a direction in which the contact arms extend. The contact arms are completely arranged below tops of the first partition walls.

DETAILED DESCRIPTION OF THE INVENTION

Figure 1:
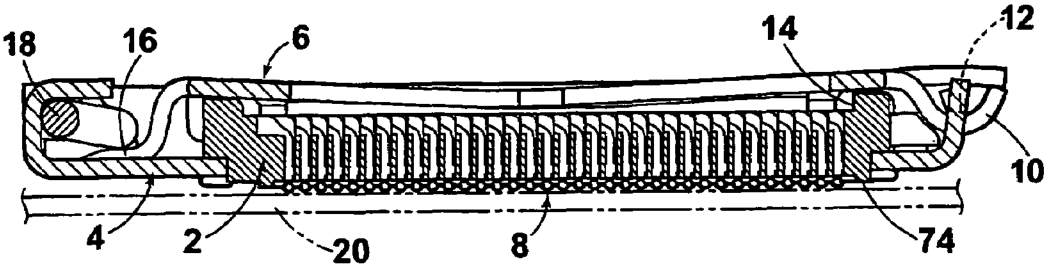
FIG. 1 is a sectional view of an IC socket according to the invention.

FIG. 1 shows an IC socket according to the invention. The IC socket comprises an insulative housing 2 mounted on a printed circuit board 20. A metallic reinforcing plate 4 is mounted on a side of a bottom surface 74 of the housing 2. A metallic cover 6 is rotatably supported by the reinforcing plate 4 and covers an upper surface of the housing 2. The cover 6 is pivotally supported by bearings 10 supported on a rotating shaft 12 of the reinforcing plate 4. An engaging piece 16 at a tip of the cover 6 is engaged by a lever 18 to urge the cover downward.

Figure 2A:
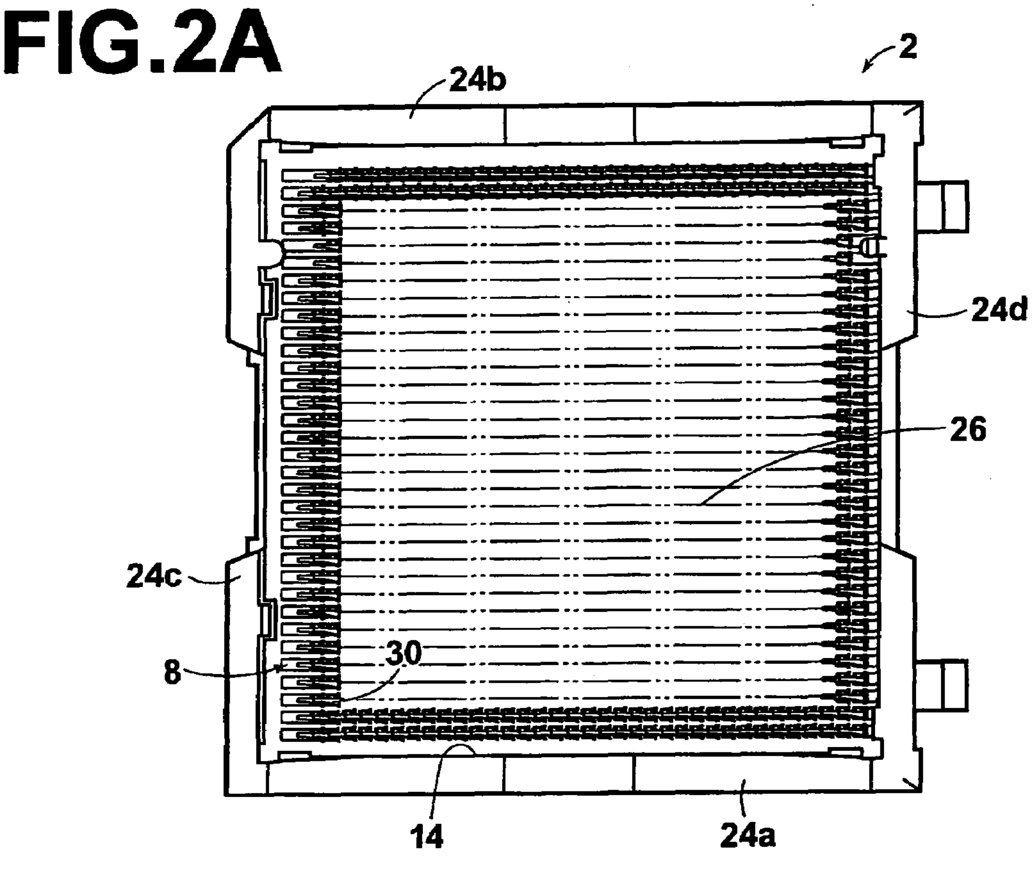
FIG. 2A is a plan view of an insulative housing.

As shown in FIG. 2A, the housing 2 has a substantially rectangular shape and may be formed, for example, by molding an insulative synthetic resin. The housing 4 has an IC package receiving recess 14. The IC package receiving recess 14 is substantially rectangular in shape and is surrounded by outer peripheral walls 24*a*, 24*b*, 24*c*, 24*d*. A plurality of contact receiving openings 30 are formed in a bottom surface 26 of the IC package receiving recess 14 and extend substantially vertically through the housing 2. The contact receiving openings 30 are arranged, for example, in the form of a matrix. In FIG. 2A, only a portion of the contact receiving openings 30 and the contacts 8 are illustrated.

Figure 5A:
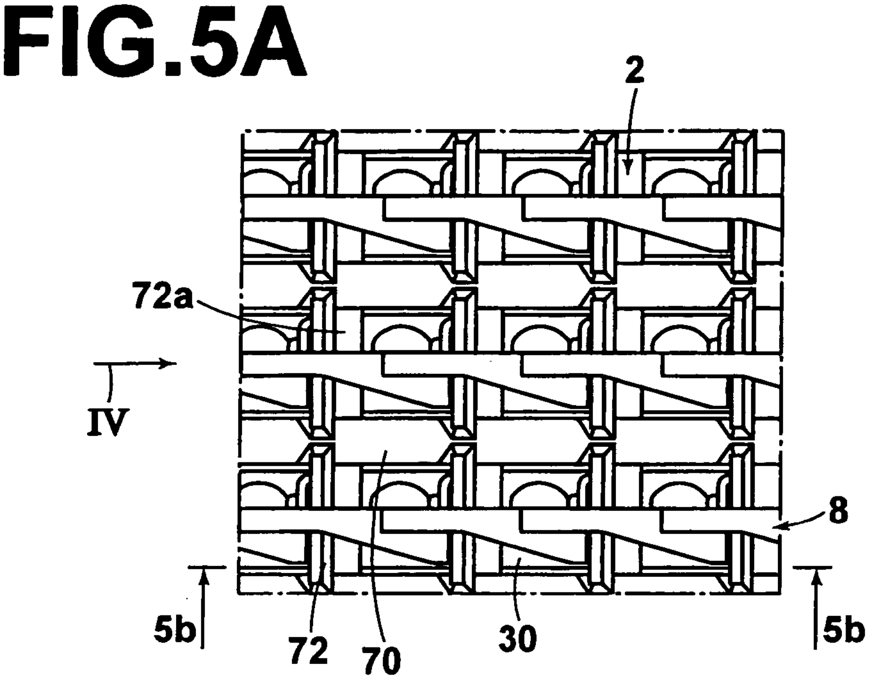
FIG. 5A is a magnified partial plan view of the housing showing the contacts press-fit therein.
Figure 5B:
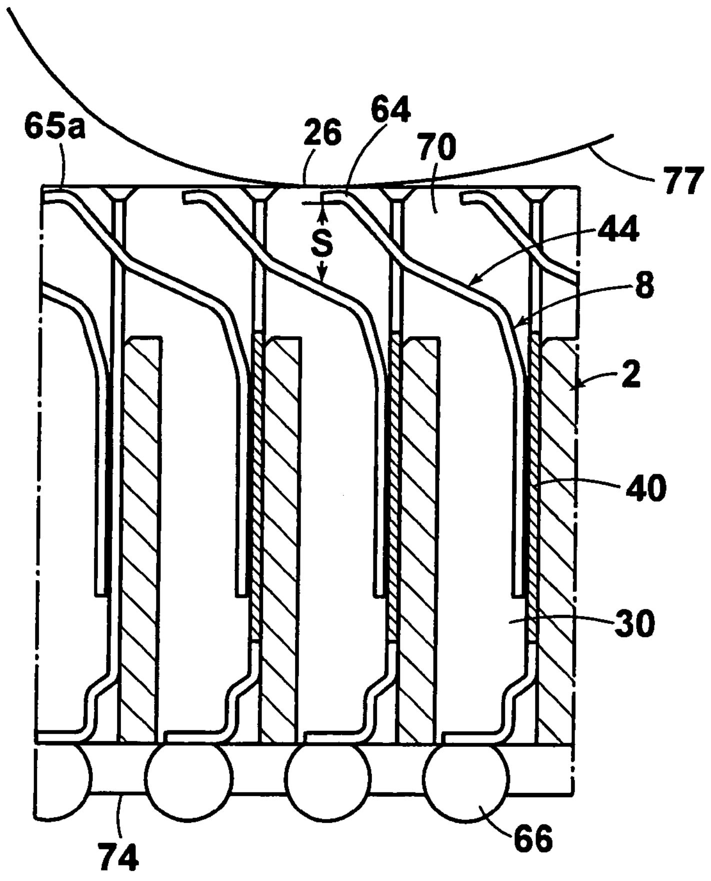
FIG. 5B is a magnified partial sectional view taken along line 5B-5B of FIG. 5A.
Figure 6:
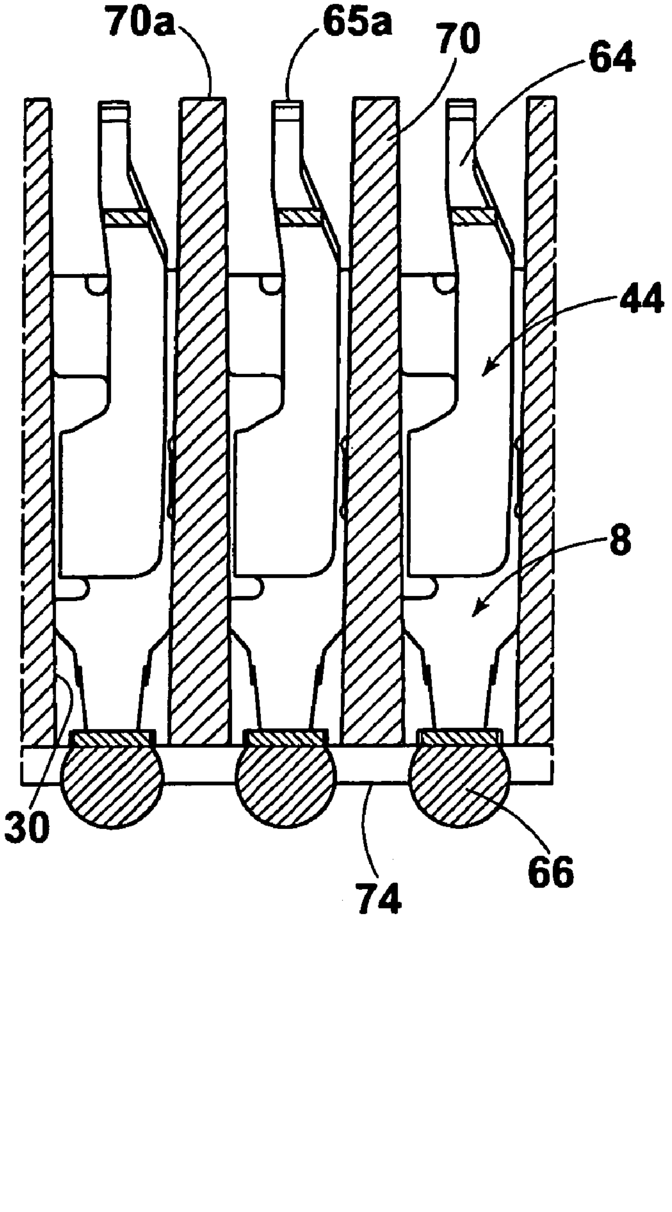
FIG. 6 is a magnified partial sectional view taken from a direction of arrow IV of FIG. 5A.
Figure 7A:
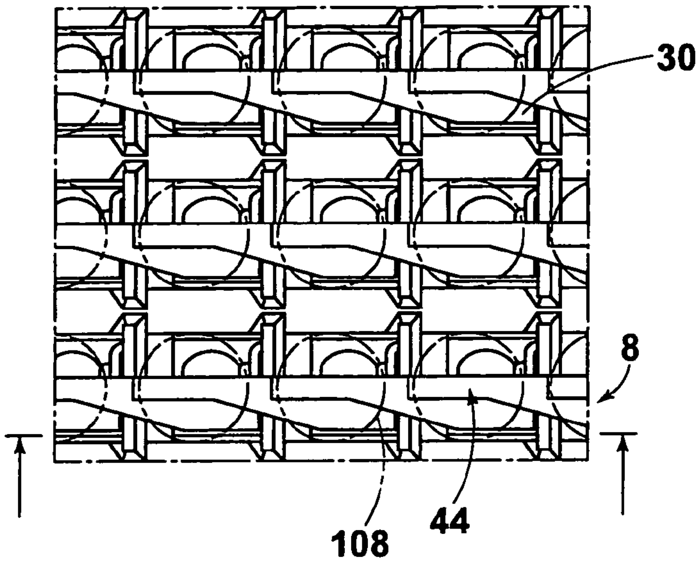
FIG. 7A is a magnified partial plan view showing the contacts when an IC package is mounted on the IC socket.
Figure 7B:
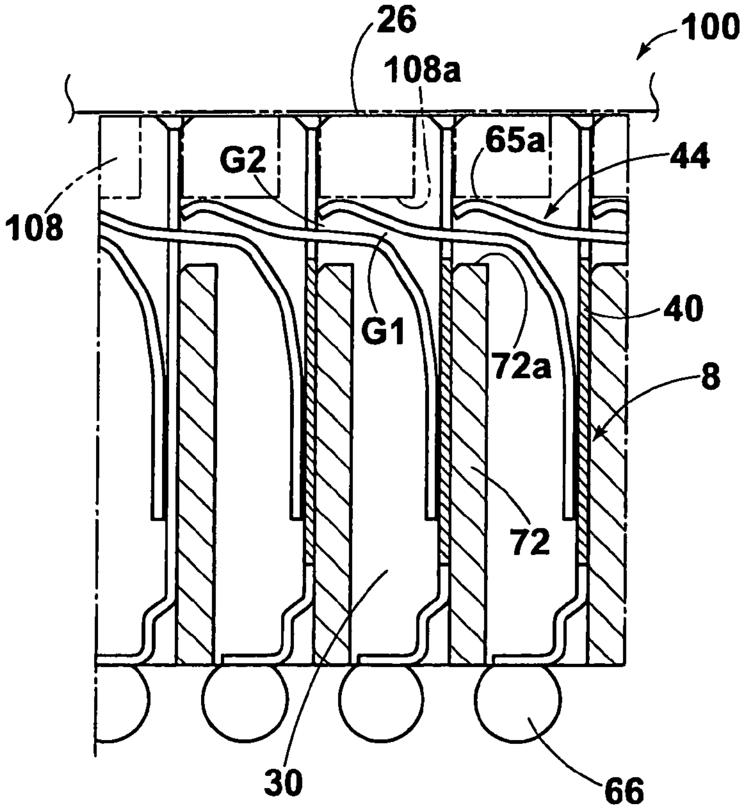
FIG. 7B is a magnified partial sectional view of the housing showing the arrangement of the contacts.

As shown in FIGS. 5A, the contact receiving openings 30 are separated by first and second partition walls 70, 72, respectively. The first partition walls 70 substantially perpendicularly intersect the second partition walls 72. The IC package receiving recess 14 is defined by the first partition walls 70. As shown in FIGS. 5B-6, tops 70*a* of the first partition walls 70 are provided at substantially the same height as the bottom surface 26 of the IC package receiving recess 14. Because burrs may be generated during molding, the tops 70*a* are designed to be positioned slightly lower than the bottom surface 26 of the IC package receiving recess 14. Tops 72*a* of the second partition walls 72 are positioned lower than the tops 70*a* of the first partition walls 70, as shown in FIG. 7B.

Figure 4A:
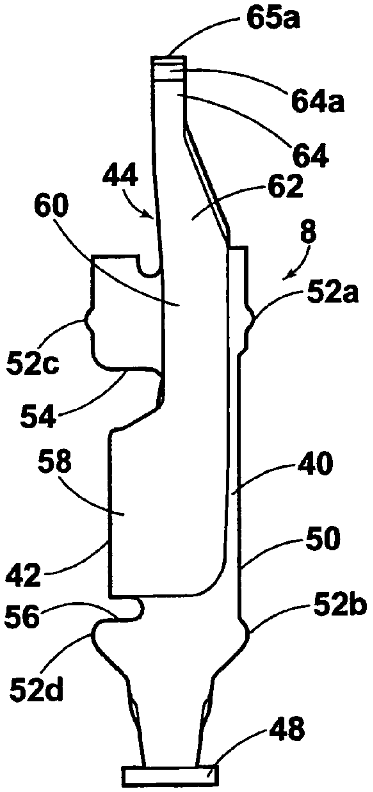
FIG. 4A is a left side view of a contact.
Figure 4B:
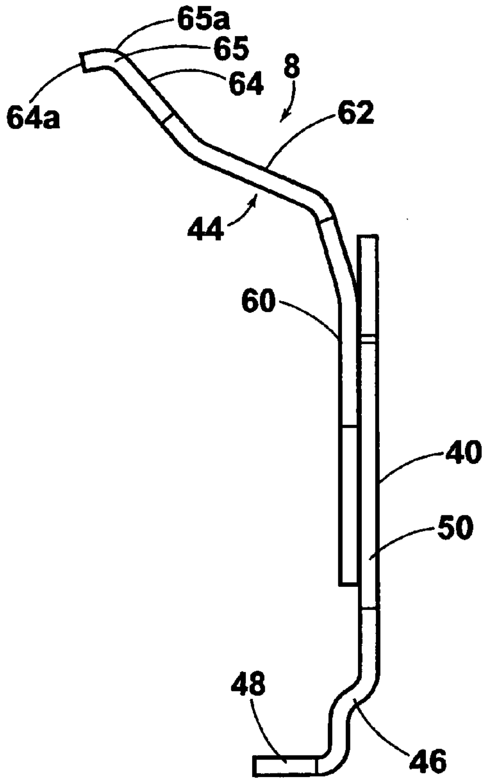
FIG. 4B is a front view of the contact.
Figure 4C:
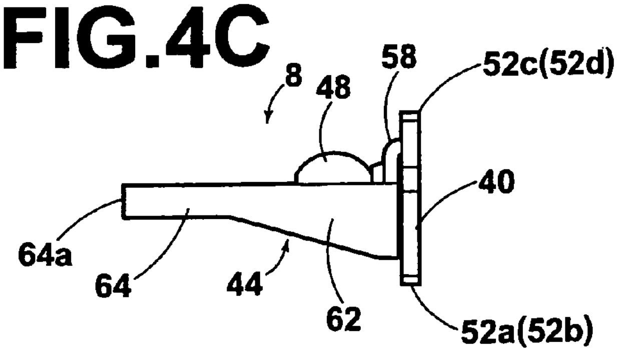
FIG. 4C is a plan view of the contact.

As shown in FIG. 2A, a plurality of contacts 8 are mounted in the IC package receiving recess 14. As shown in FIGS. 4A-4C, each of the contacts 8 comprises a base 40, a contact arm 44, and a connecting portion 48. As shown in FIGS. 4A-4B, the base 40 extends in a vertical direction and has vertically separated cutouts 54, 56 formed toward a side edge 42 thereof. Barbs 52*a*, 52*b*, 52*c*, 52*d* separated in a vertical direction are formed on the side edge 42 and a side edge 50 of the base 40.

The contact arm 44 includes a bent portion 58 bent from the side edge 42 of the base 40 so that the contact arm 44 overlaps the base 40. The vertically separated cutouts 54, 56 of the base 40 impart elasticity to the bent portion 58 of the contact arm 44. An extension portion 60 extends upward from the bent portion 58. An arm 62 extends diagonally upward away from the extension portion 60. The arm 62 gradually narrows as the arm 62 extends upward, as shown in FIG. 4C. A contact portion 64 extends upward from the arm 62 at a steeper angle than that of the arm 62, as shown in FIG. 4B. The contact portion 64 has a tip 64*a* at a free end thereof. The contact portion 64 includes a curved portion 65 that points the tip 64*a* slightly downward. An uppermost end of the curved portion 65 forms an uppermost end 65*a* of the contact arm 44. The uppermost end 65*a* of the contact arm 44 forms an electrical contact point for contacting electrodes 108 of an IC package 100, as shown in FIG. 7B. It will be appreciated by those skilled in the art that the contact arm 44 is not limited to the shape described herein. For example, the tips 64*a* of the contact portions 64 need not be curved downward, as shown in FIG. 5B, but can alternatively be only slightly curved.

As shown in FIG. 4B, the connecting portion 48 extends downward from the base 40 and is bent at a substantially right angle toward the same side of the base 40 as the contact arm 44. The connecting portion 48 has a substantially circular configuration, as shown in FIG. 4C. As shown in FIG. 5B, a solder ball 66 is formed on a lower surface of the circular portion of the connecting portion 48 and connects the contacts 8 to the circuit board 20. The solder balls 66 are omitted from FIGS. 4A-4C for ease of clarity.

Figure 2B:
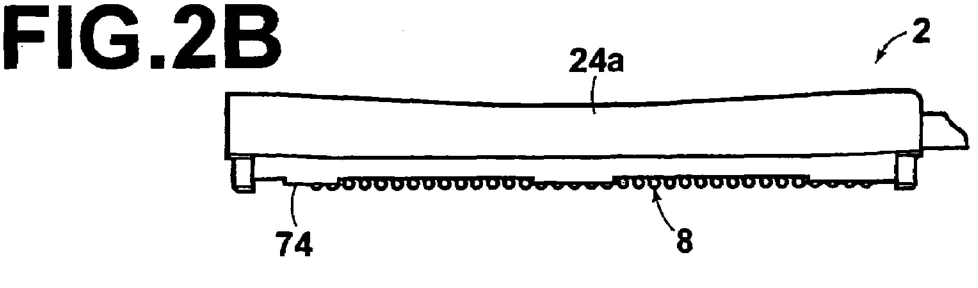
FIG. 2B is a front view of the housing.
Figure 3:
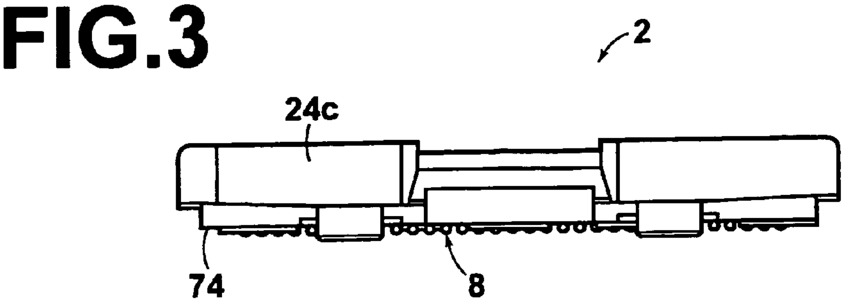
FIG. 3 is a left side view of the housing.

When the contacts 8 are press-fit into the contact receiving openings 30, the barbs 52*a*, 52*b*, 52*c*, 52*d* engage inner walls of the contact receiving openings 30 to secure the contacts 8 therein. At this time, the solder balls 66 formed on the connecting portions 48 of the contacts 8 protrude slightly from the bottom surface 74 of the housing 2, as shown in FIGS. 2B-3. As shown in FIG. 5B, the contact portions 64 of the contact arms 44 are arranged such that the contact portions 64 do not protrude upward beyond the bottom surface 26 of the IC package receiving recess 14. In other words, the tops 70*a* of the partition walls 70 are set to be of a height higher than the uppermost portions 65*a* of the contact arms 44, as shown in FIG. 6. As shown in FIG. 5B, an external object 77, such as a finger, is thereby prevented from entering the contact receiving openings 30 beyond the tops 70A of the first partition walls 70. Accordingly, the contact arms 44 are prevented from being deformed by inadvertent contact with the external object 77 during handling of the IC socket.

As shown in FIGS. 5A-5B, the contact arms 44 are aligned such that the contact arms 44 overlap in a direction in which the contact arms 44 extend. Only a narrow space for the contact receiving openings 30 is therefore needed in the direction in which the contact arms 44 extend. Because a space is not required to be formed in a direction substantially perpendicular to the direction in which the contact arms 44 extend, the contacts 8 can be arranged in a high density. For example, about 1,000 or more contacts 8 can be provided in the housing 2, when the housing 2 is of substantially the same size as a conventional housing (not shown) that houses 775 conventional contacts. In addition, although the contact arms 44 of the adjacent contacts 8 overlap each other, the heights of the first partition walls 70 are relatively high, and the heights of the tips 64*a* of the contacts 8 are set lower than those of conventional contacts (not shown). The contact portions 64 of the contact arms 44 therefore have sufficient clearance S formed there between in a vertical direction. Accordingly, the contact arms 44 will not contact each other even when in contact with the IC package 100.

Figure 8A:
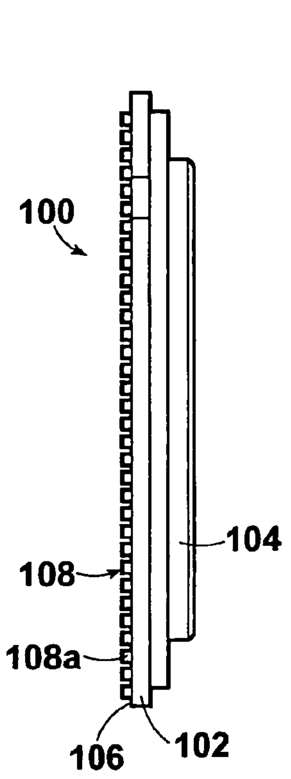
FIG. 8A is a side view of an IC package.
Figure 8B:
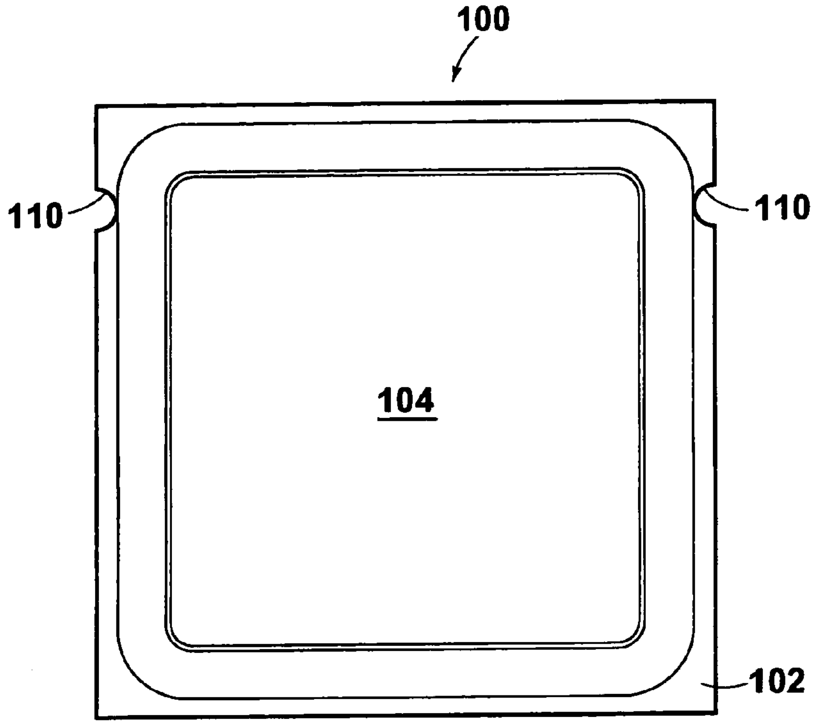
FIG. 8B is a plan view of the IC package.
Figure 8C:
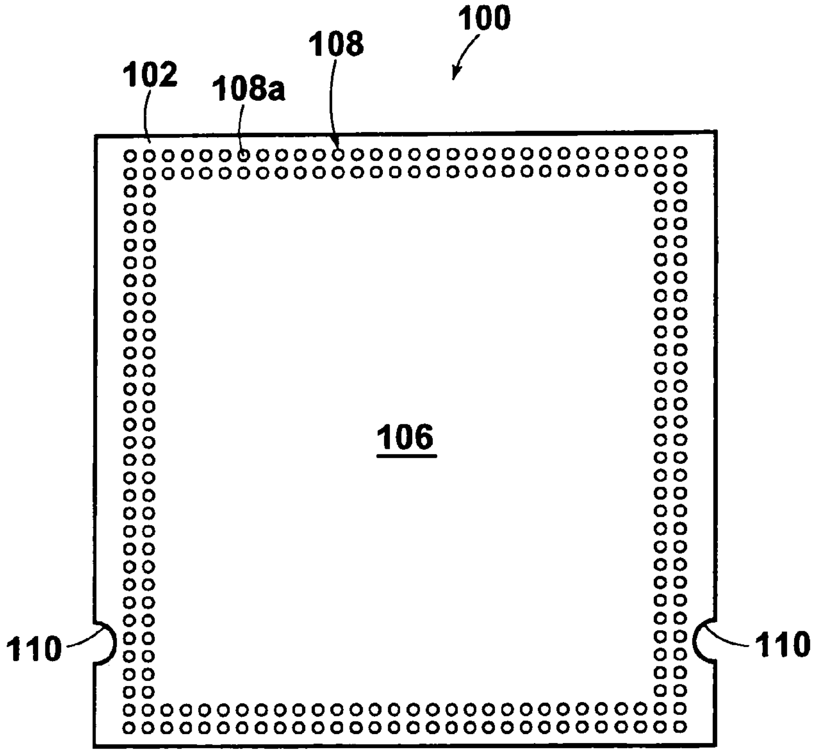
FIG. 8C is a bottom view of the IC package.

As shown in FIGS. 8A-8C, the IC package 100 comprises a substantially rectangular planar substrate 102 with a metallic cover 104 that houses an IC chip (not shown). The IC package 100 can be, for example, a modified LGA type IC package. A plurality of the electrodes 108 are provided in a bottom surface 106 of the substrate 102. The electrodes 108 are provided across the entire bottom surface 106 of the substrate 102 and correspond with the contacts 8 (only a portion of the electrodes 108 are illustrated in FIG. 8C). Each of the electrodes 108 has a flat surface 108*a* formed at a tip thereof for contacting the contact arm 44 of the contact 8. A pair of cutouts 110 is formed in the substrate 102 for preventing erroneous assembly of the IC package 100 to the IC socket. Although the electrodes 108 illustrated herein have substantially cylindrical protrusions, it will be appreciated by those skilled in the art that the electrodes 108 may have other configurations, for example, substantially cubical protrusions, etc.

In order to fix the IC package 100 to the housing 2, the IC package 100 is placed in the IC package receiving recess 14. As shown in FIGS. 7A-7B, the electrodes 108 enter the contact receiving openings 30 through the bottom surface 26 of the IC package receiving recess 14. The IC package 100 is urged downward by the cover 6 when the lever 18 is actuated to fix the IC package 100 to the housing 2 in a state in which the IC package 100 presses the contacts 8 downward. The contact arms 44 are pressed by the flat surfaces 108*a* of the electrodes 108 and flex downward. The contact arms 44 flex downward toward the upper portions of the adjacent contacts 8 without engaging the second partition walls 72. Gaps G1, G2 are formed between the contact arms 44, so that the contact arms 44 do not contact each other. Because the electrodes 108 of the IC package 100 protrude from the bottom surface 106 thereof, the first partition walls 70 can be made higher. This configuration enables the contact arms 44 to be housed within the contact receiving openings 30 without protruding upward beyond the first partition walls 70. The contact arms 44 can therefore be made long so that the contact arms 44 can be sufficiently displaced.

Figure 9:
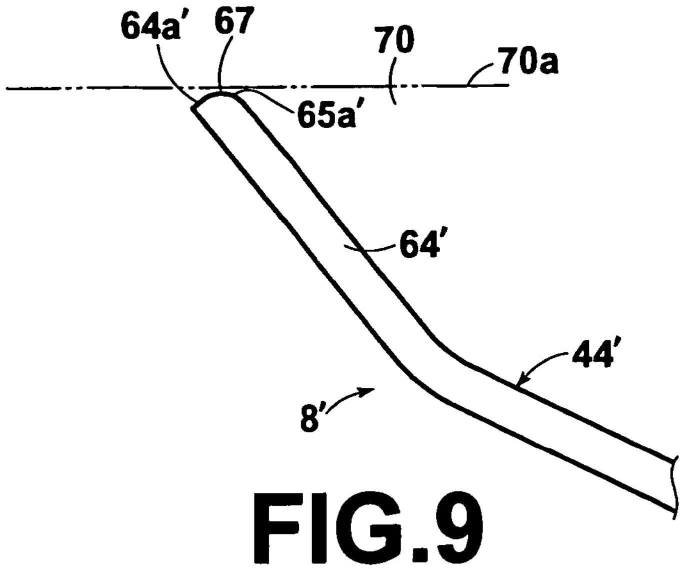
FIG. 9 is a magnified partial view of an alternate embodiment of a contact.
Figure 10:
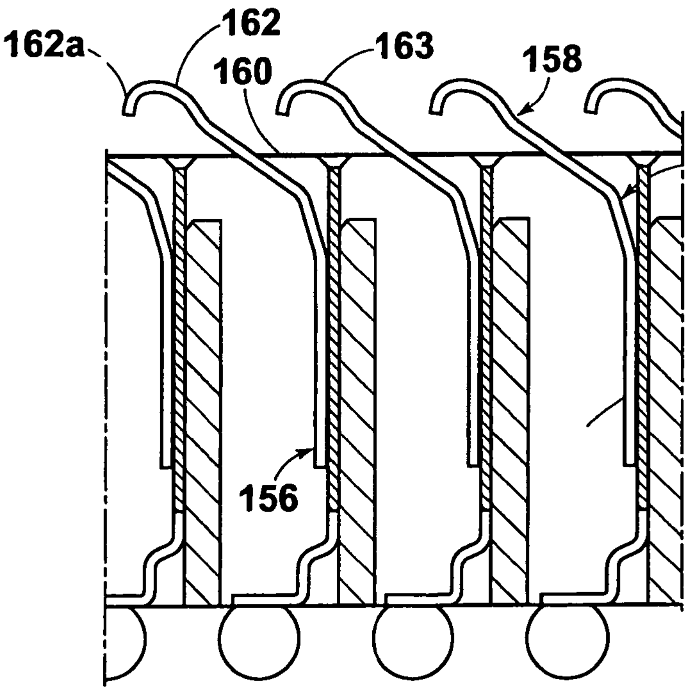
FIG.10 Prior Art
FIG. 10 is a sectional view of a contact portion of a conventional contact.

FIG. 9 shows an alternate embodiment of a contact 8'. The contact 8' includes a contact arm 44' having a contact portion 64'. The contact portion 64' extends diagonally upward in a linear manner to a tip 64*a*'. A curved surface 67 is formed at an uppermost end 65*a*' of the tip 64*a*'. The curved surface 67 is formed such that the contact arm 44' does not protrude upward beyond the top 70*a* of the first partition wall 70. Because the shape of the tip 64' of the contact arm 44' is substantially linear, the manufacture of the contacts 8' is simplified.

We claim:

1. An integrated circuit socket, comprising:

an insulative housing having an integrated circuit package receiving recess provided with a plurality of contact receiving openings arranged in a matrix;

contacts arranged in the contact receiving openings, each of the contacts having a base and a contact arm, the base being fixed to the contact receiving opening, the contact arm extending away from the base and having an arm and a contact portion extending upward from the arm, the contact portion including a curved portion with a contact point at an uppermost end, the arm and the contact portion overlapping with the contact arm of an adjacent one of the contacts when the contact arm is flexed;

first partition walls separating the contact receiving openings in a direction substantially perpendicular to a direction in which the contact arms extend, the uppermost ends being arranged below tops of the first partition walls; and a land grid array integrated circuit package provided with electrodes extending from a bottom surface of the integrated circuit package, the electrodes engaging the contact portions when the land grid array integrated circuit package is received in the integrated circuit package receiving recess.

2. The integrated circuit socket of claim 1, further comprising second partition walls separating the contact receiving openings, the second partition walls extending substantially perpendicular to the first partition walls, the uppermost ends being arranged above tops of the second partition walls.

3. The integrated circuit socket of claim 1, wherein the contact arm is bent from a side edge of the base and overlaps the base.

4. The integrated circuit socket of claim 1, wherein a connecting portion extends from the base in a direction opposite from the contact arm for connecting the contact to a circuit board.

5. The integrated circuit socket of claim 4, wherein the connecting portion is provided with a solder ball.

6. The integrated circuit socket of claim 4, wherein the connecting portion is bent at a substantially right angle toward the direction in which the contact arm extends.

7. The integrated circuit socket of claim 1, wherein the contact portion has a tip at a free end thereof that is curved toward the adjacent one of the contacts.

8. The integrated circuit socket of claim 1, wherein the tops of the first partition walls are provided at substantially the same height as a bottom surface of the integrated circuit package receiving recess.

9. The integrated circuit socket of claim 1, wherein the contact portion is substantially linear.

10. The integrated circuit socket of claim 1, wherein the electrodes have a flat surface that engages the contact portions.

11. An integrated circuit socket, comprising:

an insulative housing having an integrated circuit package receiving recess provided with a plurality of contact receiving openings arranged in a matrix;

contacts arranged in the contact receiving openings, each of the contacts having a base and a contact arm, the base being fixed to the contact receiving opening, the contact arm extending away from the base and including an arm and a contact portion extending upward from the arm, the arm and the contact portion overlapping with the contact arm of an adjacent one of the contacts when the contact arm is flexed;

first partition walls separating the contact receiving openings in a direction substantially perpendicular to a direction in which the contact arms extend, the contact arms being completely arranged below tops of the first partition walls; and second partition walls separating the contact receiving openings, the second partition walls extending substantially perpendicular to the first partition walls, the contact arms being arranged above tops of the second partition walls.

12. The integrated circuit socket of claim 11, wherein the contact arm is bent from a side edge of the base and overlaps the base.

13. The integrated circuit socket of claim 11, wherein a connecting portion extends from the base in a direction opposite from the contact arm for connecting the contact to a circuit board.

14. The integrated circuit socket of claim 13 wherein the connecting portion is provided with a solder ball.

15. The integrated circuit socket of claim 13, wherein the connecting portion is bent at a substantially right angle toward the direction in which the contact arm extends.

16. The integrated circuit socket of claim 11, wherein the tops of the first partition walls are provided at substantially the same height as a bottom surface of the integrated circuit package receiving recess.

17. The integrated circuit socket of claim 11, further comprising an integrated circuit package provided with electrodes extending from a bottom surface of the integrated circuit package, the electrodes engaging the contact arms when the integrated circuit package is received in the integrated circuit package receiving recess.

18. The integrated circuit socket of claim 17, wherein the electrodes have a flat surface that engages the contact arms.

19. The integrated circuit socket of claim 17, wherein the integrated circuit package is a land grid array integrated circuit package.

* * * * *